United States Patent [19]
Suda

[11] Patent Number: 5,898,323
[45] Date of Patent: Apr. 27, 1999

[54] LEVEL COMPARATOR

[75] Inventor: Kouichi Suda, Kawasaki, Japan

[73] Assignee: Kabushiki Kaisha Toshiba, Kawasaki, Japan

[21] Appl. No.: 08/864,072

[22] Filed: May 28, 1997

[30] Foreign Application Priority Data

May 29, 1996 [JP] Japan .................................. 8-134723

[51] Int. Cl.$^6$ .................................................. H03K 5/22
[52] U.S. Cl. .................................. 327/66; 327/89; 327/328
[58] Field of Search .................................. 327/65–67, 63, 327/77, 85, 87, 88, 89, 563, 427, 434, 309, 321, 322, 325–328, 331, 332

[56] References Cited

U.S. PATENT DOCUMENTS

| | | | |
|---|---|---|---|
| 4,728,826 | 3/1988 | Einzinger et al. | 327/427 |
| 4,885,484 | 12/1989 | Gray | 327/325 |
| 5,001,373 | 3/1991 | Bator et al. | 327/321 |
| 5,289,054 | 2/1994 | Lucas | 327/65 |
| 5,387,830 | 2/1995 | Kukimoto | 327/322 |
| 5,488,320 | 1/1996 | Carvella et al. | 327/65 |
| 5,488,321 | 1/1996 | Johnson | 327/66 |

FOREIGN PATENT DOCUMENTS 2 65409  3/1990  Japan .................. H03K 17/30

*Primary Examiner*—Toan Tran
*Attorney, Agent, or Firm*—Finnegan, Henderson, Farabow, Garrett & Dunner, L.L.P.

[57] ABSTRACT

A level comparator has a first and a second input terminal, an output terminal and a first and a second power terminal. In the comparator, the gate of a first MOS transistor is connected to the first input terminal. The gate of a second MOS transistor is connected to the second input terminal and the source of the second MOS transistor is connected to the source of the first MOS transistor. A current source is connected between the source of the first MOS transistor and the first power terminal. The drain and gate of a third MOS transistor are connected to the drain of the first input terminal and the source of the third MOS transistor is connected to the second power terminal. The drain of a fourth MOS transistor is connected to the drain of the second MOS transistor. The gate of the fourth MOS transistor is connected to the gate of the third MOS transistor. And the source of the fourth MOS transistor is connected to the second power terminal. The drain of a fifth MOS transistor is connected to the output terminal. The gate of the fifth MOS transistor is connected to the drain of the second MOS transistor. And the source of the fifth MOS transistor is connected to the second power terminal. A load is connected between the output terminal and the first power terminal. An increase in gate voltage of the fifth MOS transistor is restricted by a restricting circuit.

4 Claims, 2 Drawing Sheets

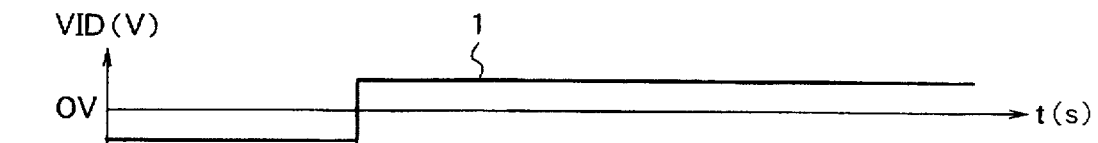
F I G. 2A
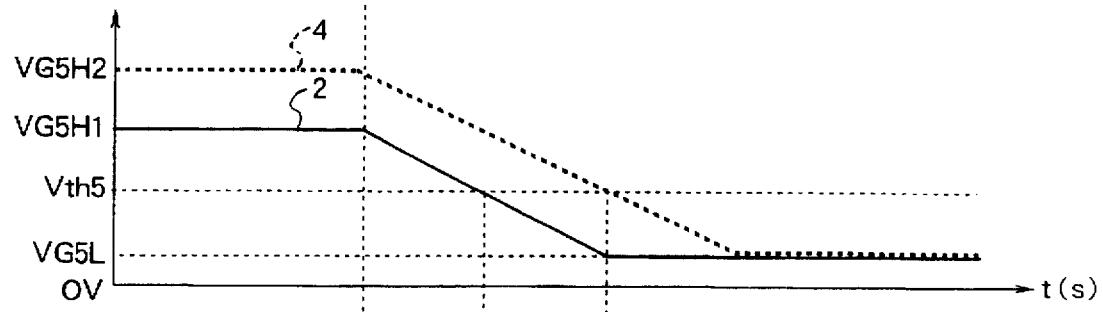
F I G. 2B
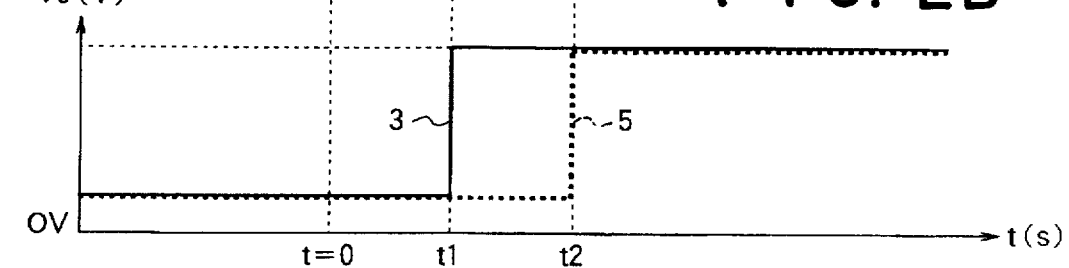
F I G. 2C

LEVEL COMPARATOR

BACKGROUND OF THE INVENTION

This invention relates to a level comparator. FIG. 1 shows a conventional level comparator. Input voltages VIN and VIP are supplied to input terminals INN and INP, respectively, of a differential transistor pair of PMOS transistors M1 and M2. The voltages VIN and VIP are compared to each other to produce an output voltage V0 at an output terminal OUT. The output voltage V0 becomes LOW when the voltage VIN is higher than the voltage VIP. On the other hand, the voltage V0 becomes HIGH when the voltage VIN is lower than the voltage VIP.

Suppose that an in-phase input voltage VIC and a differential input voltage VID are supplied to the input terminals INN and INP, respectively. The voltages VIN and VIP can be expressed as follows:

$$VIP=VIC+VID/2$$

$$VIN=VIC-VID/2$$

It is considered when the differential input voltage VID changes from a status A to a status B. Here, the status A is that the voltage VID is lower than zero and the status B is another status that the voltage VID is higher than zero. In the status A, the output voltage V0 is LOW because the voltage VIN is higher than the voltage VIP. When the status A is turned onto the status B, the output voltage V0 becomes HIGH because the voltage VIN becomes lower than the voltage VIP.

The conventional comparator has a response time tpLH. This response time is a period from a moment where the voltage VID changes its status between A and B to another moment where the output voltage V0 changes its level between HIGH and LOW.

The reason why the response time tpLH exists is explained with reference to FIGS. 2A to 2C. These figures depict the response characteristics of the conventional level comparator. A waveform 1 in FIG. 2A represents the differential input voltage VID. A waveform 2 in FIG. 2B represents the response characteristics of the gate voltage VG5 of an output NMOS transistor M5 in FIG. 1. Further, a waveform 3 in FIG. 2C represents the response characteristics of the output voltage V0.

The differential input voltage VID changes from negative to positive at a moment t (=0) as shown in FIG. 2A. In response to this, as shown in FIG. 2B, the gate voltage VG5 gradually changes from HIGH to LOW and reaches a threshold level Vth5 of the NMOS transistor M5 at a moment t1. This makes the transistor M5 start to turn on. The output voltage V0 then changes from LOW to HIGH. The rising characteristics of the output voltage V0 is generally quicker than the falling characteristics of the gate voltage VG5. This reveals that the main cause of the existence of the response time tpLH is generally the existence of a period from the moments t (=0) to t1.

A gate voltage VG5H1 (FIG. 2B) at a HIGH status of the NMOS transistor M5 is expressed as follows:

$$VG5H1=VIC-VGS2+VDS2 \quad (1)$$

on the other hand, A gate voltage VG5L (FIG. 2B) at a LOW status of the NMOS transistor M5 is expressed as follows:

$$VG5L=VDS4 \quad (2)$$

here, VGS2 and VDS2 denote a gate-to-source voltage and a drain-to-source voltage, respectively, of the NMOS transistor M2 in FIG. 1 and VDS4 a drain-to-source voltage of an MOS transistor M4 in FIG. 1.

As understood from the expression (1), the higher the in-phase input voltage VIC supplied to the input terminal INN of the differential transistor pair M1 and M2, the higher the gate voltage VG5 of the NMOS transistor M5 at the HIGH status, and thus, the longer a period at which the gate voltage VG5 drops from the HIGH status to the threshold level Vth5. This means increase in length of the response time tpLH, or a slow response characteristics of the conventional level comparator. The numeral 4 in FIG. 2B denotes the response characteristics of the gate voltage VG5 of the NMOS transistor M5 (FIG. 1) when the in-phase input voltage VIC is high. Further, The numeral 5 in FIG. 2C denotes the response characteristics of the output voltage V0 (FIG. 1) when the voltage VIC is high. A response time t2 is longer than t1. This means a longer response time tpLH and a slower response characteristics.

SUMMARY OF THE INVENTION

A purpose of the invention is to provide a level comparator that can restrict change in response time when a in-phase input voltage supplied to the level comparator varies.

The present invention provides a level comparator having a first and a second input terminal, an output terminal and a first and a second power terminal, the level comparator comprising: a first MOS transistor having a gate connected to the first input terminal; a second MOS transistor having a gate connected to the second input terminal and a source connected to a source of the first MOS transistor; a current source connected between the source of the first MOS transistor and the first power terminal; a third MOS transistor having a drain and a gate connected to a drain of the first MOS transistor and a source connected to the second power terminal; a fourth MOS transistor having a drain connected to a drain of the second MOS transistor, a gate connected to the gate of the third MOS transistor and a source connected to the second power terminal; a fifth MOS transistor having a drain connected to the output terminal, a gate connected to a drain of the second MOS transistor and a source connected to the second power terminal; a load connected between the output terminal and the first power terminal; and restricting means for restricting increase in gate voltage of the fifth MOS transistor.

It is preferable that the restricting means includes at least two sixth MOS transistors connected in series between the gate and the source of the fifth MOS transistor, a drain and a gate of each of the sixth MOS transistors being connected to each other.

It is further preferable that the level comparator further comprises supplying means, provided between the drain of the first MOS transistor and the second power terminal, for supplying a current flowing between the drain of the first MOS transistor and the second power terminal, the current being equal to a current flowing through the restricting means.

The present invention further provides a level comparator comprising: a differential amplifier circuit having at least one differential transistor pair; a current mirror circuit as an active load of the differential amplifier circuit; an output circuit having at least a load and an output transistor connected in series, an output of the differential amplifier circuit being supplied to a gate of the output transistor; and a level restricting circuit for restricting increase in gate voltage of the output transistor.

BRIEF DESCRIPTION OF THE DRAWINGS

FIG. 2A through 2C show graphs for explaining an operation of the conventional level comparator;

DETAILED DESCRIPTION OF THE PREFERRED EMBODIMENTS

A first preferred embodiment according to the invention will be described with reference to FIG. 3.

Figure 3:
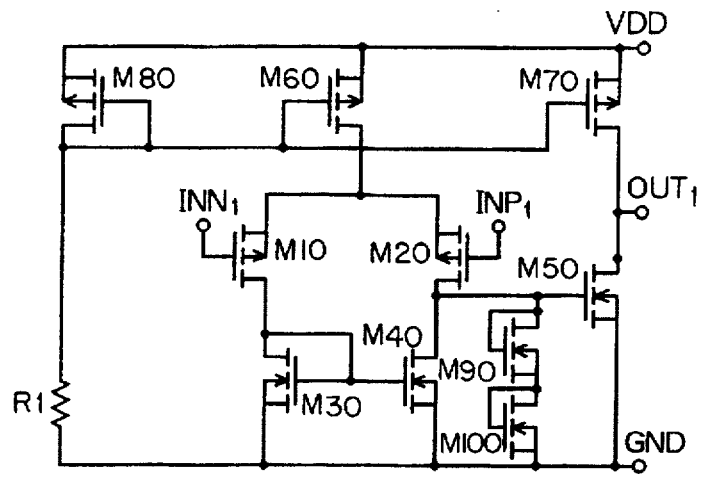
FIG. 3 is a circuit diagram showing a first preferred embodiment of the level comparator according to the invention.

In FIG. 3, PMOS transistors M10 and M20 constitute a differential transistor pair (a common source circuit.) NMOS transistors M30 and M40 constitute a current mirror circuit that works as an active load of the differential transistor pair. The gate of the PMOS transistor M10 is connected to an input terminal $INN_1$. And, the gate of the PMOS transistor M20 is connected to an input terminal $INP_1$.

PMOS transistors M60, M70 and M80 and a resistor R1 constitute another current mirror circuit. A current flows the PMOS transistors M60 and M70. This current is equal to or proportional to a drain current of the PMOS transistor M80 decided by the resistor R1. The PMOS transistor M60 works as a current source for the differential transistor pair M10 and M20.

An NMOS transistor M50 and the PMOS transistor M70 as an active load constitute an output circuit. A drain input of the NMOS transistor M20 is supplied to the gate of the NMOS transistor M50 the drain of which is connected to an output terminal $OUT_1$.

NMOS transistors M90 and M100 are connected in series between the gate of the NMOS transistor M50 and GND. These NMOS transistors M90 and M100 constitute a level restricting circuit. The gate and drain of each of the NMOS transistors M90 and M100 are connected to each other.

Input voltages $VIN_1$ and $VIP_1$ are supplied to the input terminals $INN_1$ and $INP_1$, respectively, of the differential transistor pair M10 and M20. The voltages $VIN_1$ and $VIP_1$ are compared to each other to produce an output voltage $V0_1$ at the output terminal $OUT_1$. The output voltage $V0_1$ becomes LOW when the voltage $VIN_1$ is higher than the voltage $VIP_1$. On the other hand, the voltage $V0_1$ becomes HIGH when the voltage $VIN_1$ is lower than the voltage $VIP_1$.

Suppose that an in-phase input voltage $VIC_1$ and a differential input voltage $VID_1$ are supplied to the input terminals $INN_1$ and $INP_1$, respectively. The voltages $VIN_1$ and $VIP_1$ can be expressed as follows:

$$VIP_1 = VIC_1 + VID_1/2$$

$$VIN_1 = VIC_1 - VID_1/2$$

A gate voltage VG50H at the HIGH status of the NMOS transistor M50 is clipped by the level restricting circuit (NMOS transistors M90 and M100) and expressed as follows:

$$VG50H = 2 \times Vth \tag{3}$$

here, Vth denotes each threshold level of the transistors M90 and M100.

On the other hand, a gate voltage VG50L at the LOW status of the NMOS transistor M50 is expressed as follows:

$$VG50L = VDS40 \tag{4}$$

here, VDS40 denotes the drain-to-source voltage of the NMOS transistor M40.

It is understood that the gate voltage VG50H at the HIGH status is not related to the in-phase input voltage $VIC_1$.

It is considered when the differential input voltage $VID_1$ changes from a status A to a status B. Here, the status A is that the voltage $VID_1$ is lower than zero and the status B is that the voltage $VID_1$ is higher than zero. In the status A, the output voltage $V0_1$ is LOW because the voltage $VIN_1$ is higher than the voltage $VIP_1$. When the status A is turned onto the status B, the output voltage $V0_1$ becomes HIGH because the voltage $VIN_1$ becomes lower than the voltage $VIP_1$.

The level comparator according to the invention also has a response time $tpLH_1$. This response time is a period from a moment where the voltage $VID_1$ changes its status in status between A and B to another moment where the output voltage $V0_1$ changes its level between HIGH and LOW.

Figure 1:
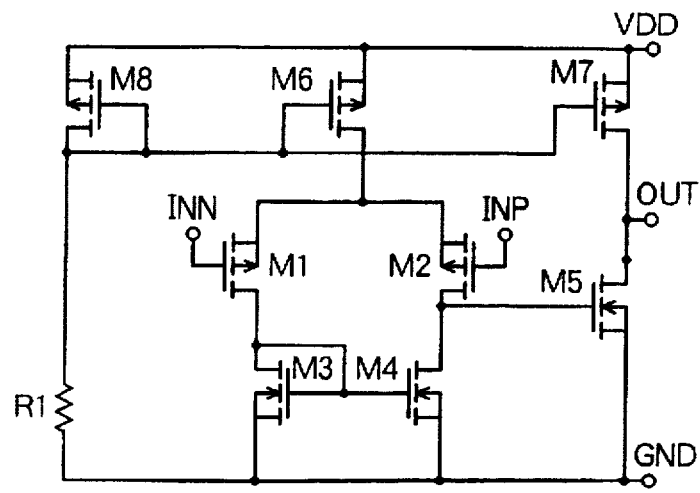
FIG. 1 is a circuit diagram showing a conventional level comparator.
Figure 4:
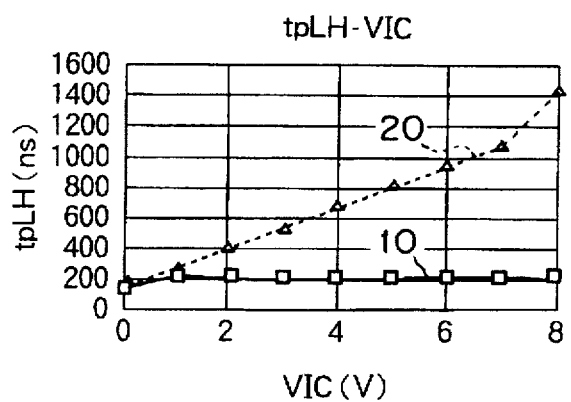
FIG. 4 is graph showing change in response time tpLH when in-phase input voltage VIC varies in the first embodiment and the conventional level comparator.

FIG. 4 shows characteristic curves of in-phase input voltage $VIC_{(1)}$ versus response time $tpLH_{(1)}$ observed by SPICE (Simulation Program with Integrated Circuit Emphasis.) A curve 10 shows $VIC_1$ -to- $tpLH_1$ of the level comparator according to the invention shown in FIG. 3. On the other hand, a curve 20 shows VIC -to- tpLH of the conventional level comparator shown in FIG. 1.

The curve 20 reveals that, in the conventional level comparator, the higher the in-phase input voltage VIC the longer the response time tpLH. On the other hand, the curve 10 of the invention reveals that response time $tpLH_1$ is very stable with respect to change in in-phase input voltage $VIC_1$.

A second preferred embodiment according to the invention will be described with reference to FIG. 5.

The difference between the first and second embodiments is that NMOS transistors M110 and M120 are additionally provided between the PMOS transistor M10 and GND in the second embodiment.

More specifically, the NMOS transistors M110 and M120 constitute a current mirror circuit as a balancing circuit. These transistors are connected in series between the drain of the PMOS transistor M10 and GND. The drain and gate of the NMOS transistors M110 are connected to each other. The gate of the NMOS transistor M120 is connected to the gate of the NMOS transistor M100. Since the NMOS transistors M110 and M120 constitute the current mirror circuit, a current flowing the NMOS transistors M110 and M120 is equal to a current flowing the NMOS transistors M90 and M100. The level comparator of FIG. 5 is formed roughly symmetrical in right and left.

According to the second preferred embodiment, it is advantageous that right and left input balance of the differential transistor pair becomes stable. Further, it is advantageous that the level comparator of the invention requires a low input offset voltage.

The first and second embodiments employ NMOS transistors the drain and gate of which are connected to each other as the level restricting circuit.

However, besides such transistors, a voltage regulating device, such as, a Zener diode can be used as the level restricting circuit and balancing circuit.

Further, a silicon bipolar transistor can be used as the level restricting circuit because about 0.7 volts of the base-to-emitter voltage of the bipolar transistor can be a constant voltage source.

However, a manufacturing cost of an electric circuit including MOS transistors and bipolar transistors is generally higher than that of an electric circuit with MOS transistors only.

Further, the base-to-emitter voltage of a silicon bipolar transistor is fixed at about 0.7 volts. On the other hand, The threshold level of a MOS transistor can easily be set at any value. Thus, setting the threshold level at a value smaller than 0.7 volts makes smaller the clipping value of the voltage level restricting circuit to achieve a short response time. Not only this, changing the threshold level can control the response time.

Figure 5:
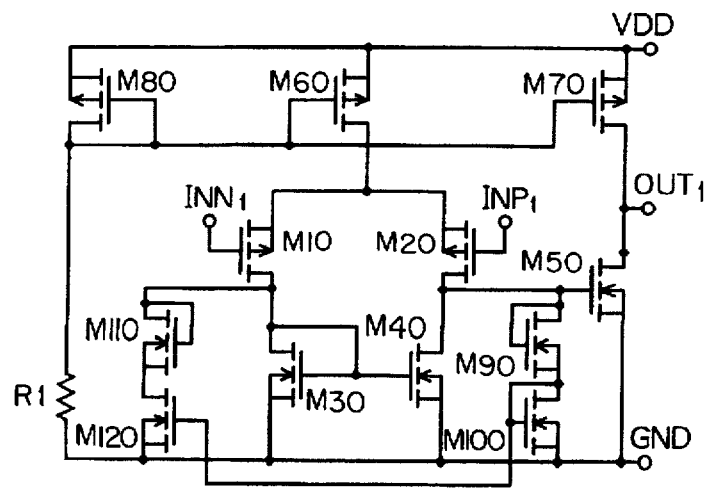
FIG. 5 is a circuit diagram showing a second preferred embodiment of the level comparator according to the invention.

In the preferred embodiments shown in FIGS. 3 and 5, NMOS transistors and PMOS transistors can be changed vice verse.

As described above, the level comparator according to the invention achieves a stable response time without respect to change in an in-phase input voltage supplied to the level comparator. Particularly, even when the in-phase input voltage becomes high, the response time does not become long. And, hence the response characteristics will be improved.

Further, the level comparator according to the invention with the voltage level restricting circuit of MOS transistors can easily control the response time by controlling threshold levels of the MOS transistors.

What is claimed is:

1. A level comparator having a first and a second input terminal, an output terminal and a first and a second power terminal, the level comparator comprising:

a first MOS transistor having a gate connected to the first input terminal;

a second MOS transistor having a gate connected to the second input terminal and a source connected to a source of the first MOS transistor;

a current source connected between the source of the first MOS transistor and the first power terminal;

a third MOS transistor having a drain and a gate connected to a drain of the first MOS transistor and a source connected to the second power terminal;

a fourth MOS transistor having a drain connected to a drain of the second MOS transistor, a gate connected to the gate of the third MOS transistor and a source connected to the second power terminal;

a fifth MOS transistor having a drain connected to the output terminal, a gate connected to a drain of the second MOS transistor and a source connected to the second power terminal;

a load connected between the output terminal and the first power terminal;

at least two sixth MOS transistors connected in series between the gate and the source of the fifth MOS transistor, a drain and a gate of each of the sixth MOS transistors being connected to each other, the sixth MOS transistors restricting increase in gate voltage of the fifth MOS transistor; and at least two seventh MOS transistors connected in series between the drain of the first MOS transistor and the second power terminal, a gate of one of the seventh MOS transistors being connected to the gate of one of the sixth MOS transistors the seventh MOS transistors supplying a current flowing between the drain of the first MOS transistor and the second power terminal, the current being equal to a current flowing through the sixth MOS transistors.

2. A level comparator comprising:
a differential amplifier circuit;

a current mirror circuit as an active load of the differential amplifier circuit;

an output circuit having at least a load and an output transistor connected in series, an output of the differential amplifier circuit being supplied to a gate of the output transistor;

a level restricting circuit including at least two first MOS transistors connected in series between the gate of the output transistor and a power supply, a drain and a gate of each of the first MOS transistors being connected to each other, the level restricting circuit restricting increase in gate voltage of the output transistor; and a current supplying circuit including at least two second MOS transistors connected in series to the differential amplifier, a gate of one of the second MOS transistors being connected to the gate of one of the first MOS transistors, the second MOS transistors supplying a current flowing through the differential amplifier, the current being equal to a current flowing through the level restricting circuit.

3. A level comparator having a first and a second input terminal, an output terminal and a first and a second power terminal, the level comparator comprising:

a first MOS transistor having a gate connected to the first input terminal;

a second MOS transistor having a gate connected to the second input terminal and a source connected to a source of the first MOS transistor;

a current source connected between the source of the first MOS transistor and the first power terminal;

a third MOS transistor having a drain and a gate connected to a drain of the first MOS transistor and a source connected to the second power terminal;

a fourth MOS transistor having a drain connected to a drain of the second MOS transistor, a gate connected to the gate of the third MOS transistor and a source connected to the second power terminal;

a fifth MOS transistor having a drain connected to the output terminal, a gate connected to a drain of the second MOS transistor and a source connected to the second power terminal;

a load connected between the output terminal and the first power terminal;

a first Zener diode connected between the gate and the source of the fifth MOS transistor, the first Zener diode restricting increase in gate voltage of the fifth MOS transistor; and a second Zener diode connected between the drain of the first MOS transistor and the second power terminal, the second Zener diode supplying a current flowing between the drain of the first MOS transistor and the second power terminal, the current being equal to a current flowing through the first Zener diode.

4. A level comparator comprising:
a differential amplifier circuit;

a current mirror circuit as an active load of the differential amplifier circuit;

an output circuit having at least a load and an output transistor connected in series, an output of the differential amplifier circuit being supplied to a gate of the output transistor;

a first Zener diode connected between the gate of the output transistor and a power supply, the first Zener diode restricting increase in gate voltage of the output transistor; and a second Zener diode connected between the differential amplifier and the power supply, the second Zener diode supplying a current flowing between the differential amplifier and the power supply, the current being equal to a current flowing through the first Zener diode.

* * * * *